United States Patent
Xu et al.

(10) Patent No.: US 12,199,379 B2
(45) Date of Patent: Jan. 14, 2025

(54) FEMALE CONNECTOR INCLUDING WAVE-ABSORBING MATERIAL IN A SPATIAL SCOPE COVERED BY A HIGH-FREQUENCY RADIATION AREA

(71) Applicant: Tianjin Laird Technologies Limited, Tianjin (CN)

(72) Inventors: Yifan Xu, Tianjin (CN); Jihai Tang, Tianjin (CN); Jingqi Zhao, Tianjin (CN)

(73) Assignee: Tianjin Laird Technologies Limited, Tianjin (CN)

( * ) Notice: Subject to any disclaimer, the term of this patent is extended or adjusted under 35 U.S.C. 154(b) by 412 days.

(21) Appl. No.: 17/772,824

(22) PCT Filed: Dec. 7, 2020

(86) PCT No.: PCT/CN2020/134257
§ 371 (c)(1),
(2) Date: Jun. 22, 2022

(87) PCT Pub. No.: WO2021/083391
PCT Pub. Date: May 6, 2021

(65) Prior Publication Data
US 2023/0027686 A1 Jan. 26, 2023

(30) Foreign Application Priority Data
Oct. 28, 2019 (CN) .......................... 201921830714.X (51) Int. Cl.
*H01R 13/6461* (2011.01)
*H01R 12/58* (2011.01)
*H01R 12/72* (2011.01)

(52) U.S. Cl.
CPC ......... *H01R 13/6461* (2013.01); *H01R 12/58* (2013.01); *H01R 12/72* (2013.01)

(58) Field of Classification Search
None
See application file for complete search history.

(56) References Cited

U.S. PATENT DOCUMENTS 4,030,792 A * 6/1977 Fuerst .................. H01R 12/585
439/82
5,947,772 A * 9/1999 Arnett .................... H01R 24/64
439/76.1

(Continued)

FOREIGN PATENT DOCUMENTS

| CN | 105392271 A | 3/2016 |
| CN | 106211542 A | 12/2016 |

(Continued)

OTHER PUBLICATIONS

PCT International Search Report and Written Opinion (and its English translation) for PCT/CN2020/134257 (WO2021083391) that is the parent application to the instant application; dated Mar. 9, 2021 (19 pages).

*Primary Examiner* — Oscar C Jimenez
(74) *Attorney, Agent, or Firm* — Harness, Dickey & Pierce, P.L.C.; Anthony G. Fussner (57) ABSTRACT

The present application provides a female connector and a connector assembly. The female connector is used to connect to a PCB board internally provided with a signal layer and a drilling hole penetrating the signal layer, the female connector including: a female terminal having two ends, one end being a connecting end for mating with a male connector or a gold finger circuit board, and the other end forming a crimping pin to be inserted into a drilling hole and connected with the signal layer; a high-frequency radiation area being formed in the vicinity of a connection between the crimping pin and the drilling hole when the connecting end is mated with the male connector or the gold finger circuit board; and a wave-absorbing material is disposed in a spatial scope (Continued)

covered by the high-frequency radiation area. By selectively disposing a wave-absorbing material in an area where a high-frequency radiation is easily generated during the use of the connector, crosstalk signals are absorbed, while normally transmitted electrical signals are kept, and an overall weight of the connector is light.

20 Claims, 6 Drawing Sheets

(56) References Cited

U.S. PATENT DOCUMENTS

| | | | | |
|---|---|---|---|---|
| 5,961,349 | A * | 10/1999 | Paagman | H05K 1/112 439/63 |
| 7,957,156 | B2 * | 6/2011 | Palomo | H01R 12/585 361/779 |
| 9,472,900 | B1 | 10/2016 | Phillips et al. | |
| 9,531,130 | B1 | 12/2016 | Phillips et al. | |
| 9,871,325 | B2 | 1/2018 | Patel et al. | |
| 2016/0324001 | A1 | 11/2016 | Zhai et al. | |
| 2016/0336691 | A1 | 11/2016 | de Boer | |
| 2017/0006698 | A1 | 1/2017 | Huang et al. | |
| 2020/0036122 | A1 * | 1/2020 | Feng | H01R 13/6473 |
| 2020/0099149 | A1 | 3/2020 | Xu et al. | |
| 2021/0234290 | A1 * | 7/2021 | Dunham | H01R 12/714 |

FOREIGN PATENT DOCUMENTS

| | | |
|---|---|---|
| CN | 107017526 A | 8/2017 |
| CN | 107069264 A | 8/2017 |
| CN | 107069266 A | 8/2017 |
| CN | 208256947 U | 12/2018 |
| CN | 208862209 U | 5/2019 |
| CN | 111029857 A | 4/2020 |
| CN | 210535884 U | 5/2020 |
| CN | 210535947 U | 5/2020 |
| CN | 210692927 U | 6/2020 |
| CN | 210897863 U | 6/2020 |
| EP | 1606859 B1 | 2/2007 |

\* cited by examiner

FEMALE CONNECTOR INCLUDING WAVE-ABSORBING MATERIAL IN A SPATIAL SCOPE COVERED BY A HIGH-FREQUENCY RADIATION AREA

CROSS-REFERENCE TO RELATED APPLICATION

This patent application is a U.S. national stage filing under 35 U.S.C. § 371 of PCT International Application No. PCT/CN2020/134257 filed Dec. 7, 2020 (published as WO2021/083391 on May 6, 2021), which claims priority to and the benefit of Chinese patent application with an application number of 201921830714.X, and an invention title of 'Female Connector and Connector Assembly' filed on Oct. 28, 2019. The entire contents of these applications are incorporated herein by reference in their entirety.

FIELD

The present disclosure relates to a technical field of connectors, and particularly to a female connector, and a connector assembly formed by mating the female connector with a male connector or a gold finger circuit board.

BACKGROUND

Connectors are widely used in the electronic field. With the rapid development of the big data, the 5G technology and the artificial intelligence applications, the connector must meet the requirements of high-speed and high-density applications, which challenges the signal integrity design of the connector, especially how to solve the problem of the crosstalk of differential signals under the high frequency/high density.

Usually, there are two traditional solutions: one is to shield a certain pair of differential signals or differential signals on a certain column in the connector by wrapping the same with metal materials and plastic materials after electroplating; and the other is to use an improved grounding method, for example, connecting the grounding pins of each pair of differential signals through conductive plastic or metal. The traditional design method uses too much shielding materials and grounding materials, which leads to negative effects such as an increased connector weight and a large plugging force. Meanwhile, it is very difficult to further realize a higher differential density by the traditional methods.

In addition to the above two methods, in order to solve the problem of the crosstalk of differential signal under a high frequency/high density, the connector or the conductor/conductor pair may be cladded with a wave-absorbing material, so as to eliminate the crosstalk of differential signals through the absorption effect of the wave-absorbing material on electromagnetic waves. However, there is a problem with the traditional way of cladding with the wave-absorbing material, i.e., the wave-absorbing material absorbs electromagnetic waves non-selectively, and while absorbing the crosstalk electromagnetic waves of the differential signals by entirely cladding the connector, the wave-absorbing material absorbs the normally transmitted electrical signals at the same time, and it is easier to destroy the signal integrity of the connector.

SUMMARY

The embodiments of the present disclosure provide a female connector, and a connector assembly formed by mating the female connector with a male connector or a gold finger circuit board. By disposing a wave-absorbing material in an area where a high-frequency radiation is easily generated during the use of the connector, the embodiments of the present disclosure realize the selectivity and the pertinence for the wave-absorbing material to absorb electromagnetic waves, thereby not only absorbing crosstalk signals of differential signals, but also keeping normally transmitted electrical signals. Thus, the signal integrity of the connector is guaranteed, and the overall weight of the connector is light.

In order to achieve the above objective, the present disclosure provides the following technical solutions.

A female connector, which is used to connect to a PCB board internally provided with a signal layer and a drilling hole penetrating the signal layer, the female connector including: a female terminal having two ends, one end being a connecting end for mating with a male connector or a gold finger circuit board, and the other end forming a crimping pin to be inserted into a drilling hole and connected with the signal layer; a high-frequency radiation area being formed in the vicinity of a connection between the crimping pin and the drilling hole when the connecting end is mated with the male connector or the gold finger circuit board; and a wave-absorbing material disposed in a spatial scope covered by the high-frequency radiation area.

A connector assembly, including a male connector and a female connector; the male connector includes a male terminal; the female connector is used to connect to a PCB board internally provided with a signal layer and a drilling hole penetrating the signal layer; the female connector includes: a female terminal having two ends, one end being a connecting end for mating with the male terminal, and the other end forming a crimping pin to be inserted into the drilling hole and connected to the signal layer; a high-frequency radiation area being formed in the vicinity of a connection between the crimping pin and the drilling hole when the connecting end is mated with the male terminal; and a wave-absorbing material disposed in a spatial scope covered by the high-frequency radiation area.

A connector assembly, including a gold finger circuit board and a female connector; the gold finger circuit board has a gold finger insertion tip; the female connector is used to connect to a PCB board internally provided with a signal layer and a drilling hole penetrating the signal layer; the female connector includes: the PCB board internally provided with a signal layer and a drilling hole penetrating the signal layer; a female terminal having two ends, one end being a connecting end for mating with the gold finger insertion tip, and the other end forming a crimping pin to be inserted into the drilling hole and connected to the signal layer; a high-frequency radiation area being formed in the vicinity of a connection between the crimping pin and the drilling hole when the connecting end is mated with the gold finger insertion tip; and a wave-absorbing material disposed in a spatial scope covered by the high-frequency radiation area.

In the embodiments of the present disclosure, it is creatively discovered and found out that a high-frequency radiation may be easily generated in the vicinity of a connection between a crimping pin and a drilling hole due to an antenna effect during the use of the connector, and practices show that the wave-absorbing material only needs to be disposed in an area where the high-frequency radiation may be easily generated rather than areas without any high-frequency radiation. By selectively or pertinently disposing the wave-absorbing material, signals are also selectively absorbed by the wave-absorbing material. That is, only crosstalk signals are absorbed without affecting normal signals, so that the integrity of differential signals may be well ensured.

In addition, the way of selectively or pertinently disposing a wave-absorbing material in a high-frequency radiation area is adopted to replace the way of entirely cladding (a plastic bracket and a shell) with a wave-absorbing material in the prior art, so as to overcome the signal crosstalk without using any additional shielding material, which not only greatly reduces the use amount of the wave-absorbing material, as well as an overall weight and costs of consumables and process implementation of the connector, but also helps in improving the density of differential pairs, and meeting the application requirements of high-speed and high-density connectors in the current technical development.

DETAILED DESCRIPTION

In order to make persons in this technical field better understand the technical solutions in the present disclosure, the technical solutions of the embodiments of the present disclosure will be clearly and completely described below with reference to the drawings for the embodiments of the present disclosure. Obviously, those described are only a part, rather than all, of the embodiments of the present disclosure. Based on the embodiments in the present disclosure, any other embodiment obtained by those of ordinary skills in the art without paying any creative labor should fall within the protection scope of the present disclosure.

It should be noted that when an element is referred to as being 'disposed on' another element, it may be directly on another element or there may be an intermediate element. When an element is considered as being 'connected to' to another element, it may be directly connected to another element or there may be an intermediate element. The terms 'vertical', 'horizontal', 'left', 'right' and similar expressions used herein are for illustration purposes only, and are not intended to indicate a unique embodiment.

Unless otherwise defined, all of the technical and scientific terms used herein have the same meanings commonly understood by a person skilled in the technical field of the present disclosure. The terms used in the specification of the present disclosure are only for the purpose of describing specific embodiments, and are not intended to limit the present disclosure. As used herein, the term 'and/or' includes any and all combinations of one or more related listed items. In addition, in the description of the present application, 'a plurality of' means two or more unless otherwise stated.

Figure 1:
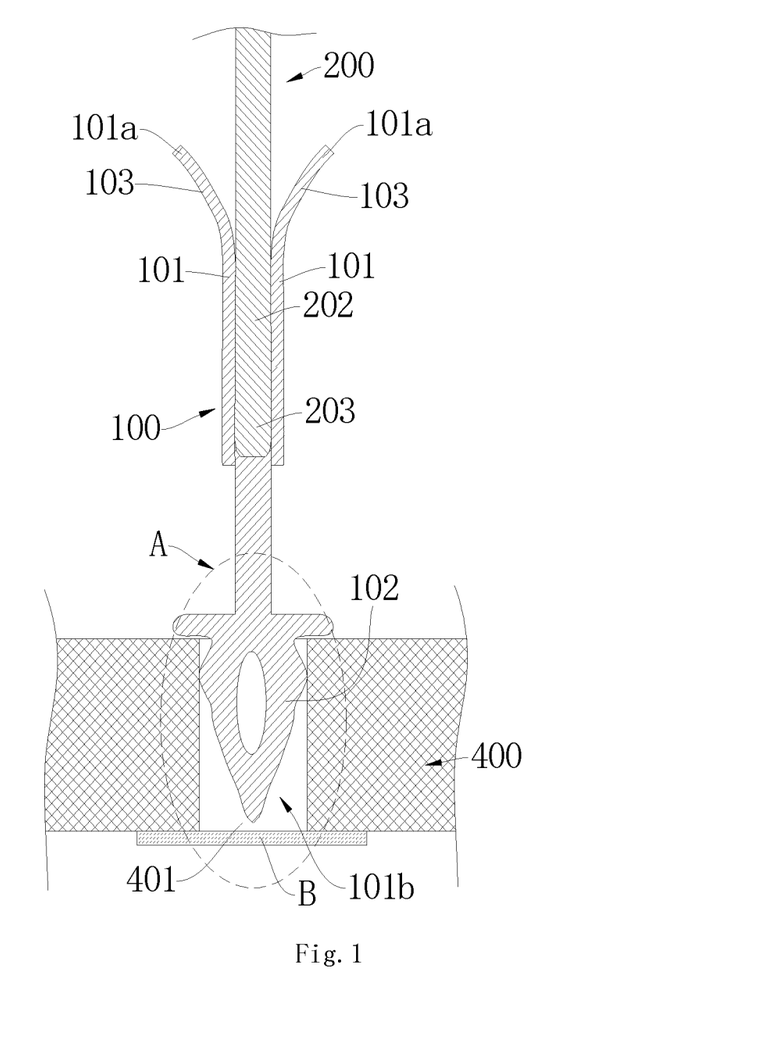
FIG. 1 is a structural diagram of a connector assembly formed by mating a female connector and a male connector according to a non-limiting embodiment of the present disclosure.
Figure 2:
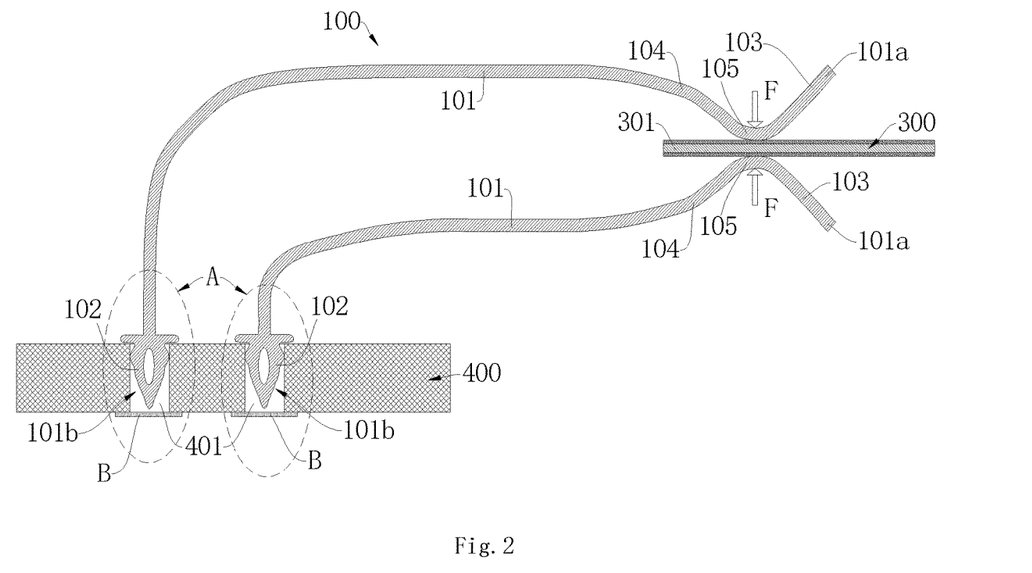
FIG. 2 is a structural diagram of a connector assembly formed by mating a female connector and a gold finger circuit board according to a non-limiting embodiment of the present disclosure.

As illustrated in FIGS. 1 and 2, an embodiment of the present disclosure provides a female connector 100, and a connector assembly formed by mating the female connector 100 with a male connector 200 or a gold finger circuit board 300.

The female connector 100 includes a female terminal 101 for mating with the male connector 200 or the gold finger circuit board 300. The female terminal 101 has two opposite ends, i.e., a connecting end 101a (an upper end illustrated in FIG. 1 and a right end illustrated in FIG. 2) for mating with the male connector 200 or the gold finger circuit board 300, and a crimping pin 101b (a lower end illustrated in FIGS. 1 and 2) facing away from the connecting end 101a for an electrical connection with a PCB board 400.

That is, in the two ends of the female terminal 101 of the female connector 100, one end is used to connect to the male connector 200 or the gold finger circuit board 300, and the other end is used to connect to the PCB board 400.

In order to make the male connector 200 or the gold finger circuit board 300 successfully mate with the female connector 100, the connecting end 101a of the female terminal 101 may be radially expanded outward to form a trumpet-shaped guide head 103 for blind mating between the male connector 200 or the gold finger circuit board 300 and the female connector 100. In this way, an operator can hold the male connector 200 or the gold finger circuit board 300 to successfully complete a mating operation with the female connector 100 under the guidance of the trumpet-shaped guide head 103.

In addition, in order to ensure a good electrical connection between the male connector 200 or the gold finger circuit board 300 and the female connector 100 after the mating, the female terminal 101 includes an elastic cantilever section 104, which is bent at at least one position to form an elastic pressing portion 105 for an interference fit contact with the male connector 200 or the gold finger circuit board 300. In this embodiment, one of the elastic pressing portions 105 is disposed close to the trumpet-shaped guide head 103.

The cantilever section 104 has a preset length, so as to have an elastic force F for unidirectionally pressing/bidirectionally clamping the male connector 200 or bidirectionally clamping the gold finger circuit board 300. As illustrated in FIG. 1, the gold finger circuit board 300 is bidirectionally clamped by the elastic pressing portions 105 formed on the cantilever section 104. Since the gold finger circuit board 300 is bidirectionally clamped by the elastic pressing portions 105, the gold finger circuit board 300 comes into a single-point contact with the single female terminal 101, thereby realizing a better mating between the gold finger circuit board 300 and the female terminal 101.

In this embodiment, there may be only one elastic pressing portion 105 formed on the cantilever section 104. At this time, the mating between the gold finger circuit board 300 and the female connector 100 is in a case of straight male-bent female.

Since the bending performance of the traditional gold finger circuit board 300 is poor, the gold finger circuit board 300 in this embodiment can follow the straight male in the prior art. However, with the development of technologies, the bendable or flexible gold finger circuit board 300 is gradually used. It is feasible that the gold finger circuit board 300 is prepared in a bent or flexed shape. Therefore, this embodiment does not exclude a case of bent male-bent female for the mating between the gold finger circuit board 300 and the female connector 100.

In the embodiment illustrated in FIG. 2, it is the case where the female terminal 101 presses the male terminal 202 of the male connector 200 unidirectionally, wherein the female terminal 101 and the male terminal 202 of the male connector 200 may be mated through a single-point contact under the condition that the female terminal 101 can contact well with the male terminal 202 of the male connector 200. At this time, the mating between the male connector 200 and the female connector 100 is in a case of straight male-bent female.

Of course, the female terminal 101 and the male terminal 202 of the male connector 200 may also be mated through a two-point or more-point contact, i.e., at this time, two or more elastic pressing portions 105 are formed on the cantilever section 104 of the female terminal 101, and two or more elastic fitting portions are also formed on the male terminal 202. The two or more elastic fitting portions and the two or more elastic pressing portions 105 contact to realize the two-point or more-point contact between the male terminal 202 and the female terminal 101. At this time, the mating between the male connector 200 and the female connector 100 is in a case of bent male-bent female.

Further, the PCB board 400 is internally provided with a signal layer (not illustrated) and a drilling hole 401 penetrating the signal layer, wherein the signal layer is horizontally disposed in the PCB board 400, and the drilling hole 401 is vertically disposed in the PCB board 400. Actually, the PCB board 400 may include a plurality of different functional layers, such as a signal layer, an intermediate board layer, an internal electrical layer, a silk screen layer, a solder paste layer, a mechanical layer, a shielding layer, a solder mask layer, solder flux layer, etc. In order to clearly and briefly describe the technical solution of this embodiment, those parts will not be repeated here, and the drawings for the specification are also simplified accordingly. However, it should be understood that the scope of the embodiments of the present application is not limited thereto.

In this embodiment, the crimping pin 101b may be inserted into the drilling hole 401 and connected to the signal layer. Specifically, as illustrated in FIGS. 1 to 3H, the crimping pin 101b has a crimping ring 102 provided with a fisheye hole. The crimping ring 102 can radially elastically contract and deform, and abut against an inner wall of the drilling hole 401 to achieve an interference fit. Specifically, the crimping ring 102 is in contact with the signal layer, so as to realize a signal connection between the female terminal 101 and the PCB board 400.

Further, an outer wall of the female terminal 101 close to the crimping pin 101b is formed with a limiting portion 101c, which abuts against a surface of the PCB board 400 (specifically, an upper surface illustrated in FIGS. 1 and 2) when the crimping pin 101b is inserted into the drilling hole 401, so as to limit the position of the female terminal 101. In this embodiment, the limiting portion 101c can play a role of stopping and limiting. During the insertion of the crimping pin 101b of the female terminal 101 into the drilling hole 401, when the limiting portion 101c abuts against the upper surface of the PCB board 400, it means that the crimping pin 101b is plugged in place. In this way, it is easy to recognize whether the crimping pin 101b and the drilling hole 401 have been assembled, thereby ensuring that the crimping pin 101b and the drilling hole 401 can be assembled in place accurately.

Generally, the female terminal 101 is flat, and the limiting portion 101c may be a plurality of protrusions circumferentially arranged at intervals formed by extending the outer wall of the female terminal 101 radially outward, so that the limiting portion 101c is circumferentially discontinuous. Of course, the limiting portion 101c may also be a circumferential flange formed by extending the outer wall of the female terminal 101 radially outward, and it is an integral structure and circumferentially continuous.

After the female connector 100 is mated with the male connector 200 or the gold finger circuit board 300, the differential signal is transmitted from one end to the other end (the connecting end 101a→the crimping pin 101b, or the crimping pin 101b→the connecting end 101a). At a position where the crimping pin 101b and the drilling hole 401 are connected, the transmission of the differential signal depends on a portion of the crimping pin 101b in contact with the drilling hole 401. Specifically, the differential signal is transmitted via a surface of the portion of the crimping pin 101b in contact with the drilling hole 401 to the signal layer. However, after a long-term study, the inventor of the present disclosure found that in a high-frequency operation condition, a high-frequency radiation area A can be easily formed at the connection between the crimping pin 101b and the drilling hole 401. Specifically, an area outside the signal layer at the connection between the crimping pin 101b and the drilling hole 401 is exposed and suspended. Therefore, due to the antenna effect, electric charges are accumulated on surfaces of the crimping pin 101b and the drilling hole 401 in the vicinity of the area, and then the high-frequency radiation area is formed in the vicinity of the connection between the crimping pin 101b and the drilling hole 401.

As described above, in order to solve the problem of the crosstalk of differential signals, the wave-absorbing material may be used to absorb the crosstalk signals, and specifically, the connector is entirely wrapped with the wave-absorbing material. However, the way of entirely wrapping with the wave-absorbing material will lead to an undifferentiated signal absorption, which is even more detrimental to the integrity of the differential signal. In addition, the full wrapping with the wave-absorbing material will increase the overall weight of the connector, and consume a lot of wave-absorbing materials, so the costs of consumables and process implementation are high.

In view of this, after long-term field practices, the inventor of the present disclosure found that the above problem can be well solved by pertinently disposing a wave-absorbing material B in an area A where the high-frequency radiation is likely to occur due to the antenna effect, while not disposing the wave-absorbing material B in other areas where no high-frequency radiation occurs. In this embodiment, the first wave-absorbing material B is disposed in a spatial scope covered by the high-frequency radiation area A.

Since being selectively or pertinently disposed in the spatial scope covered by the high-frequency radiation area A, the wave-absorbing material B can absorb the crosstalk signal on the one hand, without affecting the normal differential signal transmitted via the connection between the crimping pin 101b and the drilling hole 401, thereby ensuring the integrity of the differential signal. On the other hand, the wave-absorbing material B is only disposed in the spatial scope covered by the high-frequency radiation area A, and a use amount thereof is small, so that the female connector 100 of this embodiment is lighter in weight and lower in cost compared with the connector entirely wrapped by the wave-absorbing material B in the prior art.

In this embodiment, the spatial scope covered by the high-frequency radiation area A is a virtual space, which may be centered at the connection between the crimping pin 101b and the drilling hole 401, and expanded outward in a radial or spherical shape in a three-dimensional space. Actually, the size or dimension of the spatial scope covered by the high-frequency radiation area A is related to many factors, such as a signal intensity, a material of the female terminal 101, a connection smoothness between the crimping pin 101b and the drilling hole 401, a signal frequency, a resonance frequency, etc., which is not limited here.

Thus, as long as the position for disposing the wave-absorbing material B falls within the spatial scope covered by the high-frequency radiation area A, the specific position and way for disposing the wave-absorbing material B and the material form thereof may be relatively free and flexible. Generally, the wave-absorbing material B may support a wide frequency operation scope from 1 GHZ to 100 GHZ, and the material form may be solid (for example, including but not limited to, layer, sheet, film, block, plate, strip, cylinder), a liquid form, powder and plastic particles, etc., and the disposing way may be adopted according to the different material forms to adapt to different occasions, including but not limited to, adhesion, hot melting, electroplating, brushing, painting, filling, injection molding, etc. Therefore, the wave-absorbing material B may be customized according to the signal frequency, the resonance frequency, etc., to improve the application range of the technical solution of this embodiment.

Figure 3A:
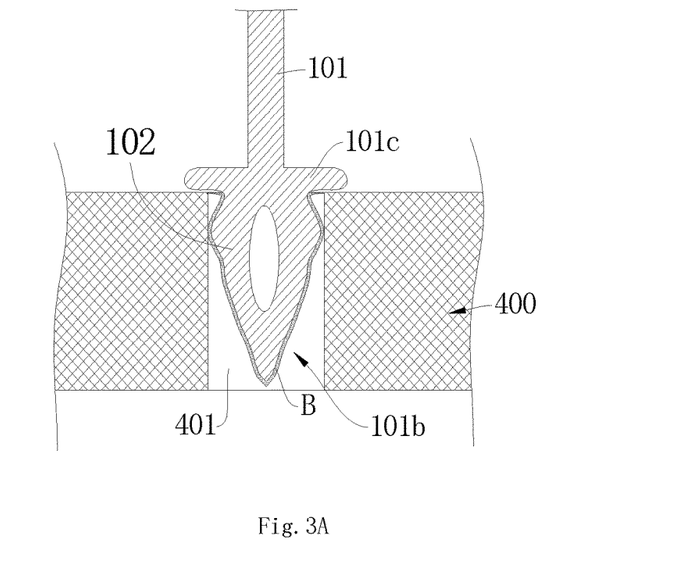
FIG. 3A is a schematic diagram of an assembly structure of a wave-absorbing material and a crimping pin or a drilling hole according to a first embodiment.

For example, in a feasible embodiment, the wave-absorbing material B may be directly disposed on the crimping pin 101b. Specifically, as illustrated in FIG. 3A, the position for disposing the wave-absorbing material B may be the outer surface of the crimping pin 101b, and the material form may be a coating, a sticking layer or a film layer. In which, the material form of the wave-absorbing material B as a coating or a film layer may be realized by a process such as spraying or electroplating; and the material form as a sticking layer may be realized by preparing the wave-absorbing material B into layers or sheets, which are then stuck by viscose glue, or fixed by hot melting, etc. The size and the thickness of the coating, the sticking layer or the film layer may be set according to the actual situation, and are not limited here.

Figure 3B:
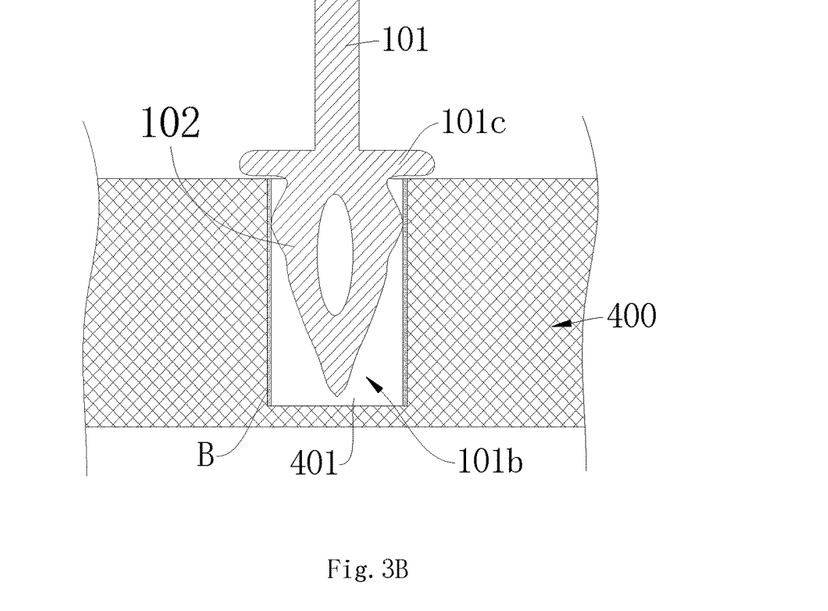
FIG. 3B is a schematic diagram of an assembly structure of a wave-absorbing material and a crimping pin or a drilling hole according to a second embodiment.

Alternatively, in the embodiment where the connector assembly is formed by mating the female connector 100 with the male connector 200 or the gold finger circuit board 300, the wave-absorbing material B may also be directly disposed in the drilling hole 401. Specifically, as illustrated in FIG. 3B, in a feasible embodiment, the position for disposing the wave-absorbing material B may be an inner wall surface of the drilling hole 401, and the material form is a coating, a sticking layer or a film layer. The specific way for disposing the wave-absorbing material B can refer to the above description, which will not be repeated here.

Figure 3C:
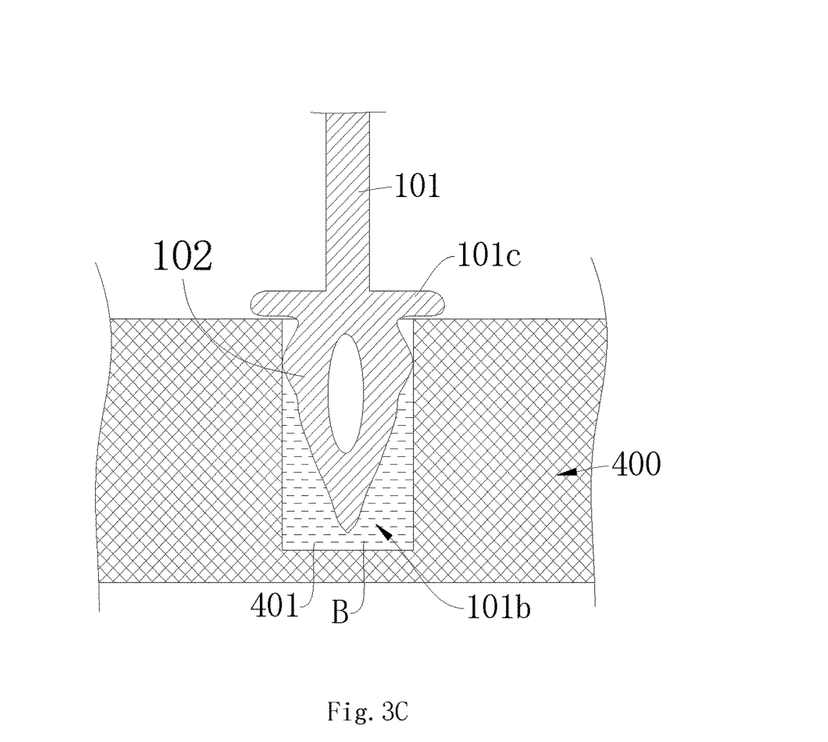
FIG. 3C is a schematic diagram of an assembly structure of a wave-absorbing material and a crimping pin or a drilling hole according to a third embodiment.

Of course, when the position for disposing the wave-absorbing material B is the drilling hole 401, the wave-absorbing material B may be located not only on the inner wall surface of the drilling hole 401, but also in the drilling hole 401. Specifically, as illustrated in FIG. 3C, in another feasible embodiment, the drilling hole 401 may be a blind hole only penetrating the upper surface of the PCB board 400 without penetrating the lower surface thereof, and the wave-absorbing material B is accommodated in the blind hole. Here the form of the wave-absorbing material B may be liquid, powder or particles, and may also be a block, a strip, etc.

Figure 3D:
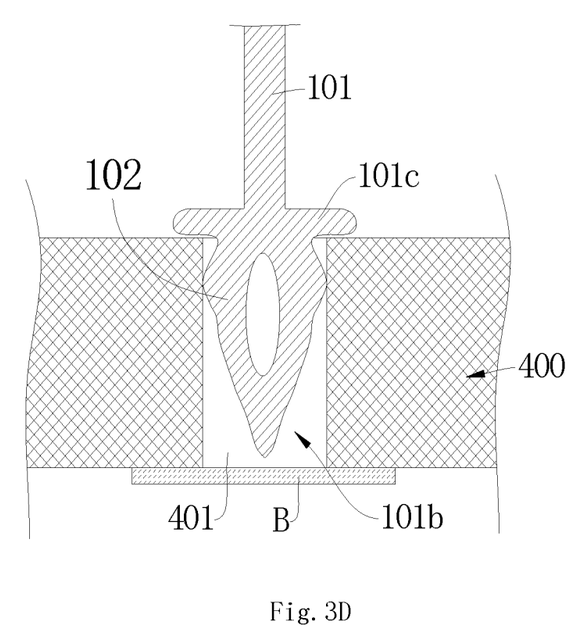
FIG. 3D is a schematic diagram of an assembly structure of a wave-absorbing material and a crimping pin or a drilling hole according to a fourth embodiment.

Of course, the drilling hole 401 is not limited to the blind hole structure described above. As illustrated in FIG. 3D, in another embodiment, the drilling hole 401 may also be a through hole penetrating the upper and lower surfaces of the PCB board 400. In this embodiment, the wave-absorbing material B may be disposed on the lower surface of the PCB board 400 in a solid state and block a bottom of the through hole. Specifically, the wave-absorbing material B is an integral solid structure, such as a layered structure, a sheet-like structure, a plate-like structure or a block-like structure, and is disposed on the lower surface of the PCB board 400 in any suitable way such as bonding, and blocks the bottom of the through hole.

It should be noted that, in the embodiment where the connector assembly is formed by mating the female connector 100 with the male connector 200 or the gold finger circuit board 300, when the wave-absorbing material B is disposed in the drilling hole 401, the crimping pin 101b may be or may not be provided with the wave-absorbing material B, which is not limited in the embodiments of the present disclosure.

In addition, the above-mentioned 'upper surface' and 'lower surface' are schematic explanations according to the drawings. In the actual use of the female connector 100, the 'upper surface' does not necessarily mean that it is located above the 'lower surface'. The descriptions of the 'upper surface' and the 'lower surface' are used here for the convenience of illustration only, and are not intended to limit the orientation. Actually, a surface of the PCB board 400 close to the female terminal 101 may be defined as the 'upper surface', and a surface of the PCB board 400 facing away from the female terminal 101 may be defined as the 'lower surface'.

In another feasible embodiment, the wave-absorbing material B may also be disposed on a plastic bracket (not illustrated) which wraps and fixes the female terminal 101. Specifically, the wave-absorbing material B is disposed close to the crimping pin 101b and the drilling hole 401, so as to be as close as possible to a high-frequency radiation source. The material form may be a coating, a sticking layer or a film layer, or a solid form. As described above, when the material form is a coating, a sticking layer or a film layer, the wave-absorbing material B may be disposed on a surface of the plastic bracket. When the material form is a solid form, such as block, plate, sheet and any other tangible physical shape, the wave-absorbing material B may be fixed on the plastic bracket in any suitable way, for example including but not limited to, snap-fit connection, mechanical fastener connection by bolts and other fastening structures, soldering by ultrasonic, solvent, laser, etc., hot melting, clamping, snap connection, hook connection and integrated fastening features.

Figure 3E:
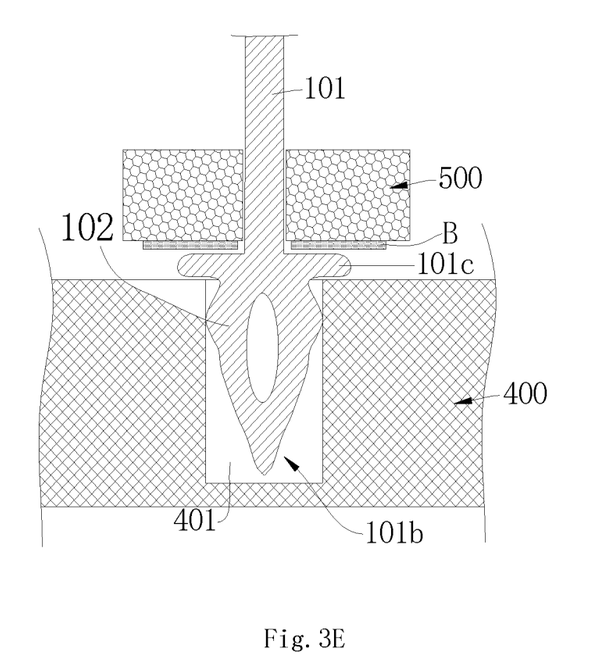
FIG. 3E is a schematic diagram of an assembly structure of a wave-absorbing material and a crimping pin or a drilling hole according to a fifth embodiment.

Further, the plastic bracket may be accommodated in a shell 500. As illustrated in FIG. 3E, in another feasible embodiment, the wave-absorbing material B may be disposed on the shell 500. Specifically, the wave-absorbing material B is disposed close to the crimping pin 101b and the drilling hole 401. The material form may be a coating, a sticking layer or a film layer, or a solid form. Please refer to the above description for detail, which will not be repeated here.

Practices have proved that the embodiment illustrated in FIG. 3E is more effective when being applied in the case where the drilling hole 401 is a blind hole. The reason is that, since the drilling hole 401 is a blind hole with a lower end blocked, a crosstalk signal generated at the connection between the crimping pin 101*b* and the drilling hole 401 cannot or is difficult to propagate downward in the blind hole, but can only or preferably propagate toward an upper opening end of the blind hole. In view of this, the wave-absorbing material B may be disposed on the shell 500 and close to an opening end facing the blind hole. That is, in the embodiment illustrated in FIG. 3E, the wave-absorbing material B may be disposed on the lower surface of the shell 500, and directly faces the upper opening end of the drilling hole 401. Further, a projection (downward projection) of the wave-absorbing material B toward the PCB board 400 preferably completely covers the upper opening end of the drilling hole 401. In this way, the crosstalk signal escaping via a gap between the crimping pin 101*b* and the drilling hole 401 and the upper opening end of the drilling hole 401 can be just absorbed by the wave-absorbing material B, so that the crosstalk signal can be absorbed more pertinently and the absorption effect is better.

Of course, the above embodiments are merely a few feasible schematic solutions, rather than restrictive solutions. That is, the position and way for disposing the wave-absorbing material B and the material form thereof include but are not limited to the above embodiments. In other feasible embodiments, for example, when the wave-absorbing material B is prepared in the form of liquid, powder, plastic particles, etc., a suitable implementation process may be adopted according to actual demands, which is not limited here.

It should be noted that the plastic bracket, the shell 500, etc. included in the female connector 100 of the embodiment of the present disclosure may adopt any suitable existing configuration. In order to clearly and briefly explain the technical solution provided by this embodiment, the above parts will not be described in detail here, and the drawings for the specification are also simplified accordingly. However, it should be understood that the embodiments of the present disclosure are not limited thereto in the spatial scope.

Figure 3F:
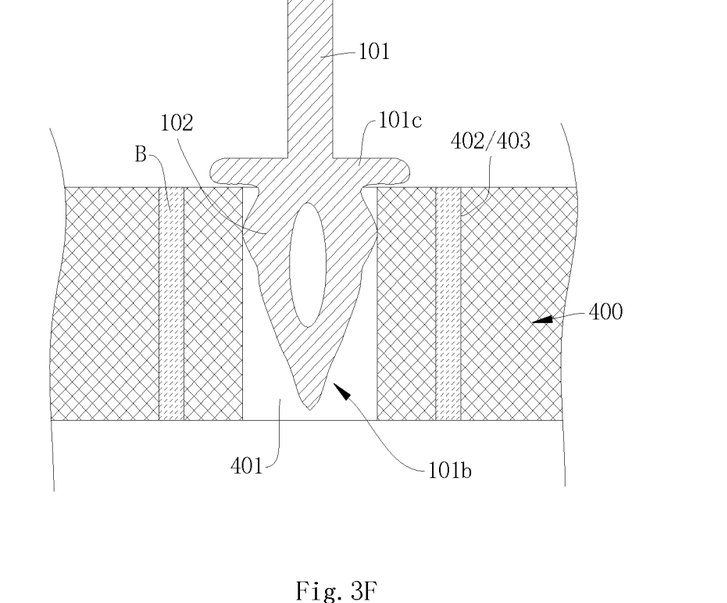
FIG. 3F is a schematic diagram of an assembly structure of a wave-absorbing material and a crimping pin or a drilling hole according to a sixth embodiment.
Figure 3G:
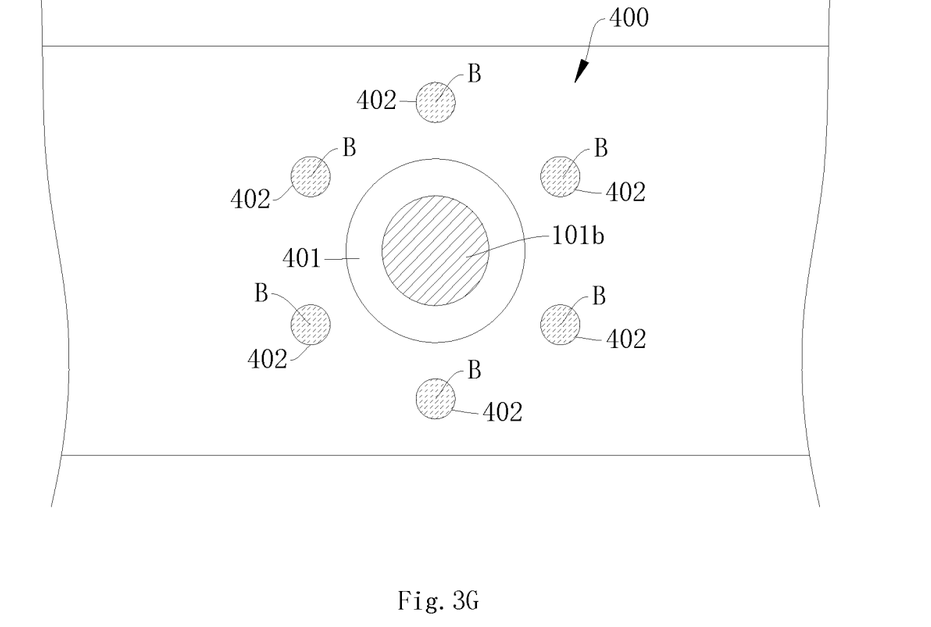
FIGS. 3G and 3H are top views of FIG. 3F.

In the embodiment where the connector assembly is formed by mating the female connector 100 with the male connector 200 or the gold finger circuit board 300, the wave-absorbing material may also be disposed in the PCB board 400 and close to the crimping pin 101*b* and the drilling hole 401. Specifically, as illustrated in FIGS. 3F and 3G, in an embodiment, the PCB board 400 may be provided with a plurality of filling holes 402 around the drilling hole 401, and the wave-absorbing material may be disposed in the filling holes 402. In this embodiment, the filling hole 402 may be a blind hole or a through hole. As described above, the wave-absorbing material may be coated on the inner wall surface of the filling hole 402 in the form of a coating, a sticking layer or a film layer, or disposed in the filling hole 402 in a solid state, or filled in the filling hole 402 in the form of liquid, powder or particles, which is not limited to in this embodiment. In addition, the number of the filling holes 402 may be set according to the actual need, and the plurality of filling holes 402 are preferably arranged in an annular array around the drilling hole 401, so that crosstalk signals can be uniformly absorbed.

Figure 3H:
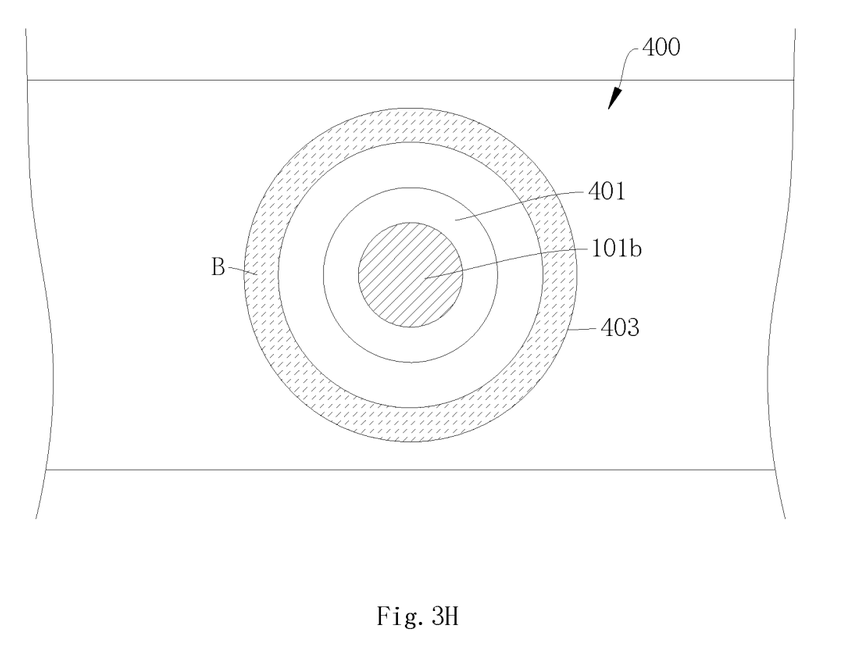

In the embodiment where a plurality of wave-absorbing materials B are circumferentially arranged around the crimping pin 101*b* and the drilling hole 401 at a same interval, the plurality of wave-absorbing materials B substantially enclose to form a hollow cylindrical shape. That is, the wave-absorbing materials B distributed around the crimping pin 101*b* and the drilling hole 401 are circumferentially discontinuous. Of course, the wave-absorbing materials B may be continuously disposed around the crimping pin 101*b* and the drilling hole 401 circumferentially. Specifically, as illustrated in FIG. 3H, in another embodiment, the PCB board 400 may be provided with a filling annular groove 403 around the drilling hole 401, and the wave-absorbing materials are disposed in the filling annular groove 403. In this embodiment, the filling annular groove 403 may only penetrate an upper surface of the PCB board 400, or both the upper surface and a lower surface of the PCB board 400. Similarly, the wave-absorbing materials may be coated on an inner groove surface of the filling annular groove 403 in the form of a coating, a sticking layer or a film layer, or disposed in the filling annular groove 403 in a solid state, or filled in the filling annular groove 403 in the form of liquid, powder or particles, which is not limited here.

Based on the same concept, an embodiment of the present disclosure further provides a connector assembly formed by mating the female connector 100 and the male connector 200 or the gold finger circuit board 300 described in the above embodiments. Since the principle for the connector assembly to solve problems and the technical effect that can be achieved are similar to those of the female connector 100, the implementation of the female connector 100 as described above may be referred to for the implementation of the connector assembly, and the repeated content will be omitted here.

It should be noted that as an independent embodiment, the connector assembly provided in the embodiment of the present disclosure may refer to the female connector 100 as described above, but should not be limited to the effect produced by the female connector 100.

FIG. 1 illustrates a structural diagram of a connector assembly formed by mating a male connector 200 and the female connector 100 described in the above embodiments, wherein the male connector 200 includes a male terminal 202 for mating with the female terminal 101, and the male terminal 202 has a male insertion tip 203 inserted into the female terminal 101. The female connector 100 is used to connect to the PCB board 400 internally provided with a signal layer and a drilling hole 401 penetrating the signal layer. When the connecting end 101*a* of the female terminal 101 is mated with the male terminal 202, a high-frequency radiation area A is formed in the vicinity of the connection between the crimping pin 101*b* and the drilling hole 401, and a wave-absorbing material B is disposed in a spatial scope covered by the high-frequency radiation area A.

FIG. 2 illustrates a structural diagram of a connector assembly formed by mating the gold finger circuit board 300 and the female connector 100 described in the above embodiments, wherein the gold finger circuit board 300 has a gold finger insertion tip 301 inserted into the female terminal 101. The female connector 100 is used to connect to the PCB board 400 internally provided with a signal layer and a drilling hole 401 penetrating the signal layer. When the connecting end 101*a* of the female terminal 101 is mated with the gold finger insertion tip 301, a high-frequency radiation area A is formed in the vicinity of the connection between the crimping pin 101*b* and the drilling hole 401, and a wave-absorbing material B is disposed in a spatial scope covered by the high-frequency radiation area A.

In the embodiments of the present disclosure, it is creatively discovered and found out that a high-frequency radiation can be easily generated in the vicinity of the connection between the crimping pin 101b and the drilling hole 401 due to an antenna effect during the use of the connector, and practices show that the wave-absorbing material B only needs to be disposed in the area where the high-frequency radiation can be easily generated rather than areas where no high-frequency radiation is generated. By selectively or pertinently disposing the wave-absorbing material B, signals are also selectively absorbed by the wave-absorbing material B. That is, only crosstalk signals are absorbed without affecting normal signals, so that the integrity of differential signals can be well ensured.

In addition, the way of selectively or pertinently disposing a wave-absorbing material B in a high-frequency radiation area is adopted to replace the way of entirely wrapping (a plastic bracket and a shell 500) with a wave-absorbing material B in the prior art, so as to overcome the signal crosstalk without using any additional shielding material, which not only greatly reduces the use amount of the wave-absorbing material B, as well as an overall weight and costs of consumables and process implementation of the connector, but also helps in improving the density of differential pairs, and meeting the application requirements of high-speed and high-density connectors in the current technical development.

Of course, the above embodiments are merely a few feasible schematic solutions, rather than restrictive solutions. That is, the position and way for disposing the wave-absorbing material B and the material form thereof include but are not limited to the above embodiments. In other feasible embodiments, for example, when the wave-absorbing material B is prepared in the form of liquid, powder, plastic particles, etc., a suitable implementation process may be adopted according to actual demands, which is not limited here.

Those described above are just a few embodiments of the present disclosure, and a person skilled in the art can make various changes or modifications to the embodiments of the present disclosure according to the content disclosed in the application document without departing from the spirit and scope of the present disclosure.

The invention claimed is:

1. A female connector configured for being connected to a PCB board that is internally provided with a signal layer and a drilling hole penetrating the signal layer, the female connector comprising:
    a female terminal having two ends, one end being a connecting end for mating with a male connector or a gold finger circuit board, and the other end forming a crimping pin to be inserted into the drilling hole and connected with the signal layer;
    a high-frequency radiation area formed in the vicinity of a connection between the crimping pin and the drilling hole when the connecting end is mated with the male connector or the gold finger circuit board; and
    a wave-absorbing material selectively or pertinently disposed only in a spatial scope covered by the high-frequency radiation area where high-frequency radiation is likely to occur due to the antenna effect while not disposing the wave-absorbing material in other areas where no high-frequency radiation occurs, such that only crosstalk signals are absorbed by the wave-absorbing material without affecting normal differential signals, thereby ensuring the integrity of the differential signal.

2. The female connector according to claim 1, wherein the wave-absorbing material is disposed on an outer surface of the crimping pin.

3. The female connector according to claim 1, wherein an outer wall of the female terminal close to the crimping pin is formed with a limiting portion that abuts against a surface of the PCB board when the crimping pin is inserted into the drilling hole to thereby limit the position of the female terminal.

4. The female connector according to claim 1, wherein:
    the female terminal is partially wrapped and fixed by a plastic bracket that is accommodated in a shell; and
    the wave-absorbing material is disposed on the plastic bracket and/or the shell and is close to the crimping pin.

5. A connector assembly comprising:
    a male connector including a male terminal;
    a female connector configured for being connected to a PCB board that is internally provided with a signal layer and a drilling hole penetrating the signal layer; the female connector including:
        a female terminal having two ends, one end being a connecting end for mating with the male terminal, and the other end forming a crimping pin to be inserted into the drilling hole and connected to the signal layer;
        a high-frequency radiation area being formed in the vicinity of a connection between the crimping pin and the drilling hole when the connecting end is mated with the male terminal; and
        a wave-absorbing material selectively or pertinently disposed only in a spatial scope covered by the high-frequency radiation area where high-frequency radiation is likely to occur due to the antenna effect while not disposing the wave-absorbing material in other areas where no high-frequency radiation occurs, such that only crosstalk signals are absorbed by the wave-absorbing material without affecting normal differential signals, thereby ensuring the integrity of the differential signal.

6. The connector assembly according to claim 5, wherein the wave-absorbing material is disposed in the drilling hole and on an outer surface of the crimping pin.

7. The connector assembly according to claim 5, wherein the wave-absorbing material is disposed on an inner wall surface of the drilling hole.

8. The connector assembly according to claim 5, wherein:
    the drilling hole is a blind hole that only penetrates an upper surface of the PCB board without penetrating a lower surface thereof; and
    the wave-absorbing material is accommodated in the blind hole.

9. The connector assembly according to claim 5, wherein:
    the drilling hole is a blind hole that only penetrates an upper surface of the PCB board without penetrating a lower surface thereof;
    the female terminal is fixed on a shell; and
    the wave-absorbing material is disposed on the shell and is close to an opening end facing the blind hole.

10. The connector assembly according to claim 5, wherein:
    the drilling hole is a through hole that penetrates an upper surface and a lower surface of the PCB board; and the wave-absorbing material is disposed on the lower surface of the PCB board and blocks a bottom of the through hole.

11. The connector assembly according to claim 5, wherein:
    the PCB board is provided with a plurality of filling holes around the drilling hole; and
    the wave-absorbing material is disposed in the filling holes.

12. The connector assembly according to claim 5, wherein:
    the PCB board is provided with a filling annular groove around the drilling hole; and
    the wave-absorbing material is disposed in the filling annular groove.

13. A connector assembly comprising:
    a gold finger circuit board including a gold finger insertion tip;
    a female connector configured for being connected to a PCB board that is internally provided with a signal layer and a drilling hole penetrating the signal layer; the female connector including:
        a female terminal having two ends, one end being a connecting end for mating with the gold finger insertion tip, and the other end forming a crimping pin to be inserted into the drilling hole and connected to the signal layer;
        a high-frequency radiation area formed in the vicinity of a connection between the crimping pin and the drilling hole when the connecting end is mated with the gold finger insertion tip; and
        a wave-absorbing material selectively or pertinently disposed only in a spatial scope covered by the high-frequency radiation area where high-frequency radiation is likely to occur due to the antenna effect while not disposing the wave-absorbing material in other areas where no high-frequency radiation occurs, such that only crosstalk signals are absorbed by the wave-absorbing material without affecting normal differential signals, thereby ensuring the integrity of the differential signal.

14. The connector assembly according to claim 13, wherein the wave-absorbing material is disposed in the drilling hole and on an outer surface of the crimping pin.

15. The connector assembly according to claim 13, wherein the wave-absorbing material is disposed on an inner wall surface of the drilling hole.

16. The connector assembly according to claim 13, wherein:
    the drilling hole is a blind hole that only penetrates an upper surface of the PCB board without penetrating a lower surface thereof; and
    the wave-absorbing material is accommodated in the blind hole.

17. The connector assembly according to claim 13, wherein:
    the drilling hole is a blind hole that only penetrates an upper surface of the PCB board without penetrating a lower surface thereof;
    the female terminal is fixed on a shell; and
    the wave-absorbing material is disposed on the shell and is close to an opening end facing the blind hole.

18. The connector assembly according to claim 13, wherein:
    the drilling hole is a through hole that penetrates an upper surface and a lower surface of the PCB board; and
    the wave-absorbing material is disposed on the lower surface of the PCB board and blocks a bottom of the through hole.

19. The connector assembly according to claim 13, wherein:
    the PCB board is provided with a plurality of filling holes around the drilling hole; and
    the wave-absorbing material is disposed in the filling holes.

20. The connector assembly according to claim 13, wherein:
    the PCB board is provided with a filling annular groove around the drilling hole; and
    the wave-absorbing material is disposed in the filling annular groove.

* * * * *